United States Patent
Huang et al.

(10) Patent No.: US 7,043,042 B2
(45) Date of Patent: May 9, 2006

(54) BUTTON APPARATUS WITH A SPEAKER

(75) Inventors: Chien-Lung Huang, Taipei (TW); William Wang, Taipei (TW); Roger Lee, Taipei (TW)

(73) Assignee: High Tech Computer, Corp., Tao Yuan (TW)

( * ) Notice: Subject to any disclaimer, the term of this patent is extended or adjusted under 35 U.S.C. 154(b) by 137 days.

(21) Appl. No.: 10/249,420

(22) Filed: Apr. 8, 2003

(65) Prior Publication Data

US 2004/0081329 A1    Apr. 29, 2004

(30) Foreign Application Priority Data

Oct. 25, 2002  (TW) .............................. 91217161 U

(51) Int. Cl.
*H04R 9/06* (2006.01)

(52) U.S. Cl. ...................... 381/334; 381/332; 381/87; 381/386; 381/394; 381/395; 200/5 R

(58) Field of Classification Search ................ 381/334, 381/332, 87, 386, 394, 395; 181/198, 199
See application file for complete search history.

(56) References Cited

U.S. PATENT DOCUMENTS

| | | | |
|---|---|---|---|
| 6,282,436 B1 * | 8/2001 | Crisp | 455/575.4 |
| 6,655,863 B1 * | 12/2003 | Lin | 400/491 |
| 6,664,486 B1 * | 12/2003 | Yoon et al. | 200/5 A |
| 6,670,563 B1 * | 12/2003 | Jeon | 200/11 R |
| 2003/0107549 A1 * | 6/2003 | Lu | 345/156 |
| 2003/0116412 A1 * | 6/2003 | Lu | 200/5 R |

* cited by examiner

*Primary Examiner*—Huyen Le
*Assistant Examiner*—Justin Michalski
(74) *Attorney, Agent, or Firm*—Jiang Chyun IP Office

(57) ABSTRACT

A button apparatus with a speaker (100) has a frame (104), a speaker (108), a flexible PCB (110), a metal dome (114), a rubber layer (116), and an operating button (120,124). The frame has a cavity (106) and the speaker is securely received in the cavity. The flexible PCB is located on the frame. The metal dome is located on the flexible PCB, and adapted to electrically connect with the flexible PCB. The rubber layer is located on the flexible PCB. The rubber layer has a protrusion (118) to press the metal dome so that the metal dome is electrically coupling to the flexible PCB. The operating button is located on the rubber layer. The button is adapted to press the protrusion, which in turn presses the metal dome.

4 Claims, 3 Drawing Sheets

BUTTON APPARATUS WITH A SPEAKER

CROSS REFERENCE TO RELATED APPLICATIONS

This application claims the priority benefit of Taiwan application serial no. 91217161, filed Oct. 25, 2002.

BACKGROUND OF INVENTION

1. Field of Invention

The present invention generally relates to a button apparatus, and more particularly, to a button apparatus with a speaker.

2. Description of Related Art

Thanks to the great progress of technology and highly developed manufacturing techniques, various electronic products have been developed based on the direction of making it lighter, thinner, shorter and smaller, so that customer requirements can be fulfilled. Electronic products such as personal digital assistants (PDAs), palm game units, electronic dictionaries, mobile phones and notebook computers are all dedicated to miniaturization. All these electronic products are equipped with audio/video (AV) effects and integrate various functions into a single product. How to integrate these functional modules into a limited space is a major endeavor direction.

For a PDA or palm game unit, it requires a large space for accommodating a speaker and an operating button. FIG. 1 schematically shows a PDA having a conventional operating button 12 and speaker 22. The conventional operating button 12 is attached to a front cover 10 of the PDA in a cantilevered manner, having one end thereof fixed to a post 14 of the front cover 10. The operating button 12 further has an actuating stud 16 extending rearwardly for activating a switch 18 on a circuit board 20. The speaker 22 is located on a bottom of the circuit board 20, and the broadcast direction of the speaker 22 is facing a rear cover 24 of the PDA, so that sound waves generated by the speaker 22 are sent out by passing the rear cover 24 as shown by arrows 26 of FIG. 1.

The major defect of this prior art is that the speaker 22 can not be located at the same side with the operating button 12 in respect to the circuit board 20, to avoid taking up too much space. That is, the switch 18 and the speaker 22 are located on opposite sides of the circuit board 20, respectively. Therefore, the space occupied is relatively large, which is disadvantageous in view of the miniaturization trend. Moreover, since the broadcast direction of the speaker 22 is facing the rear cover 24 and the user is in the direction of the front cover 10, the sound quality received by the user is poor. In the case where a protection cover (not shown) is used to enclose the PDA, the sound quality is more deteriorated since the sound waves are absorbed by the protection cover.

FIG. 2 schematically shows an operating button 52 with a speaker 60 of a PDA in accordance with a related art. In this related art, the speaker 60 is located below and received in the four-directional operating button 52 to save the space originally occupied by the speaker 22 of FIG. 1. The four-directional operating button 52 is used for depressing a four-switch assembly 56 on a circuit board 58 via a four-side pressing arm 54 of the operating button 52 so as to control a directional movement of a cursor of the PDA. By using this type of button structure, the four-directional operating button 52 itself does not have to be fixed on a front cover 50 of the PDA, and the broadcast direction of the speaker 60 located in the four-directional control button 52 is facing up as shown by arrows 62, which are facing forwardly to the direction of the user.

Although the structure mentioned above can improve the defect of the button/speaker structure of FIG. 1, however, since the speaker 60 is received in the four-directional operating button 52, the size of the four-directional operating button 52 should be large enough to accommodate the speaker 60. Furthermore, since the speaker 60 is secured inside the four-directional operating button 52, when the four-directional operating button 52 is being pressed, the speaker 60 moves with the operating button 52. The movement of the speaker 60 affects the quality of sound generated by the speaker 60. Moreover, in this related art, since the depressing force from the operating button 52 directly acts on the PCB 58, the PCB 58 should be a rigid PCB so it is strong enough to resist the depressing force. A rigid PCB has a large thickness, which results in that the button/speaker structure in accordance with the related art has a relatively large height, and the PDA incorporating the button/speaker structure of the related art accordingly cannot have a low profile.

SUMMARY OF INVENTION

To solve the above problems, it is an objective of the present invention to provide a button apparatus with a speaker, which can effectively utilize space and make the whole button/speaker assembly have a small thickness.

It is another objective of the present invention to provide a button apparatus with a speaker, which can improve the sound quality of the speaker received by a user.

It is still another objective of the present invention to provide a button apparatus with a speaker, which can independently locate the speaker without considering the button design so as to provide a versatile design.

To achieve the objectives mentioned above, a button apparatus with a speaker provided by the present invention comprises a frame, a speaker, a flexible PCB, a metal dome, a rubber layer, and a button. The frame has a cavity and the speaker is put in the cavity. The flexible PCB is located on the frame. The metal dome is located on the flexible PCB, and adapted to electrically connect with the flexible PCB. The rubber layer is located on the flexible PCB. The rubber layer has a protrusion to press the metal dome so that the metal dome is electrically coupled to the flexible PCB. The button is located on the rubber layer. When the button is depressed, the protrusion of the rubber layer is motivated to depress the metal dome to electrically connect with the flexible PCB. Sound generated by the speaker moves forwardly through the flexible PCB, the rubber layer and the button to a user of an electronic device incorporating the button apparatus with a speaker in accordance with the present invention.

A plurality of holes are defined in the frame, the flexible PCB, the rubber layer, and the button at a position corresponding to the speaker, so that the sound generated by the speaker can be easily transmitted through the electronic device to the user.

Since the button/speaker structure according to the present invention us a flexible PCB and a metal dome, the overall height of the button/speaker structure is reduced. Thus, the electronic device incorporating the button apparatus with a speaker in accordance with the present invention can have a low profile. Moreover, the speaker and the button are located on opposite sides of the flexible PCB, respectively. They do not interfere with each other, so a more versatile design which fully utilizes the space can be obtained.

BRIEF DESCRIPTION OF DRAWINGS

The accompanying drawings are included to provide a further understanding of the invention, and are incorporated in and constitute a part of this specification. The drawings illustrate an embodiment of the invention, and together with the description, serve to explain the principles of the invention. In the drawings, FIG. 1 schematically shows a structure of a conventional button with a speaker received in a PDA.

DETAILED DESCRIPTION

Figure 1:
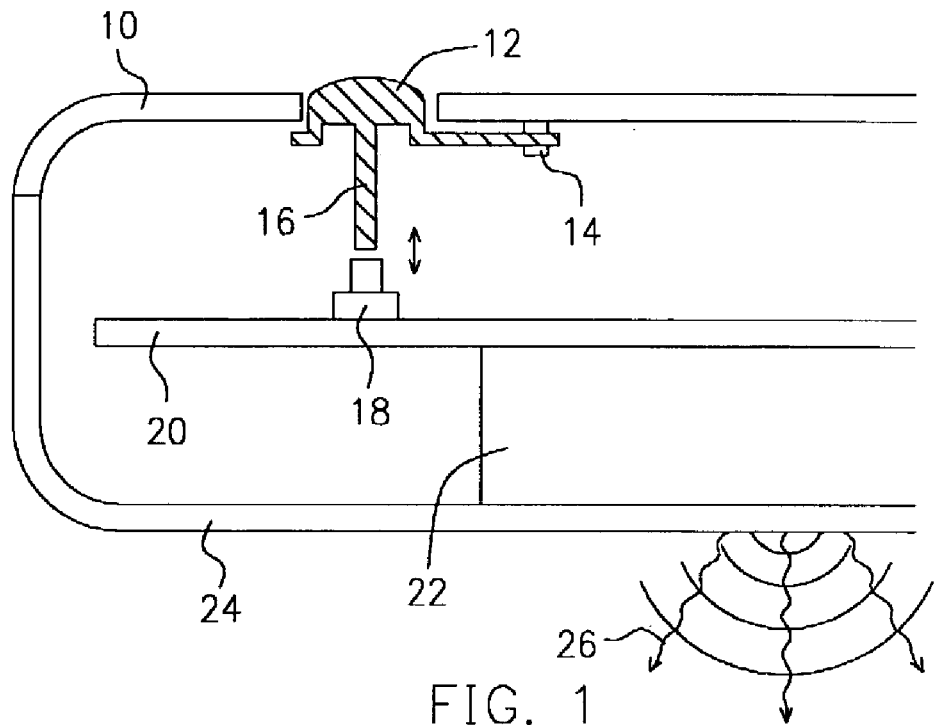
Figure 2:
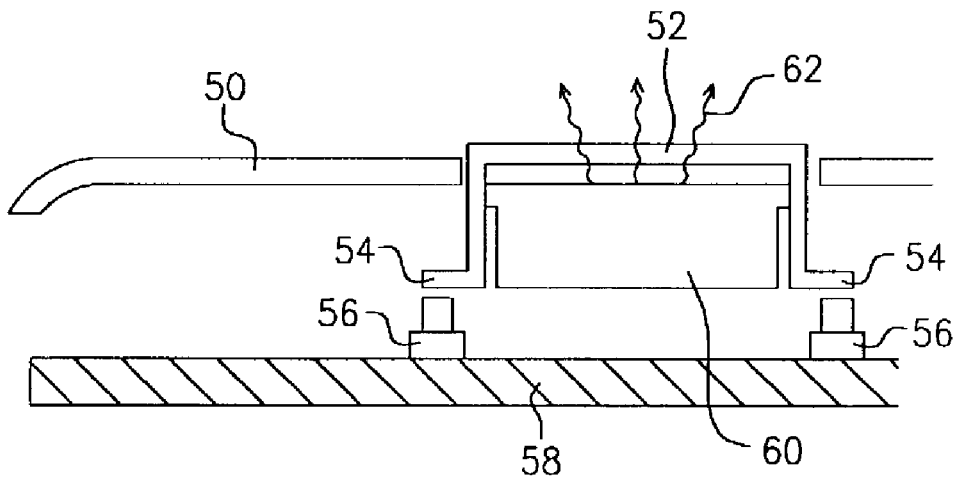
FIG. 2 schematically shows a structure of a button with a speaker of related art received in a PDA.
Figure 3:
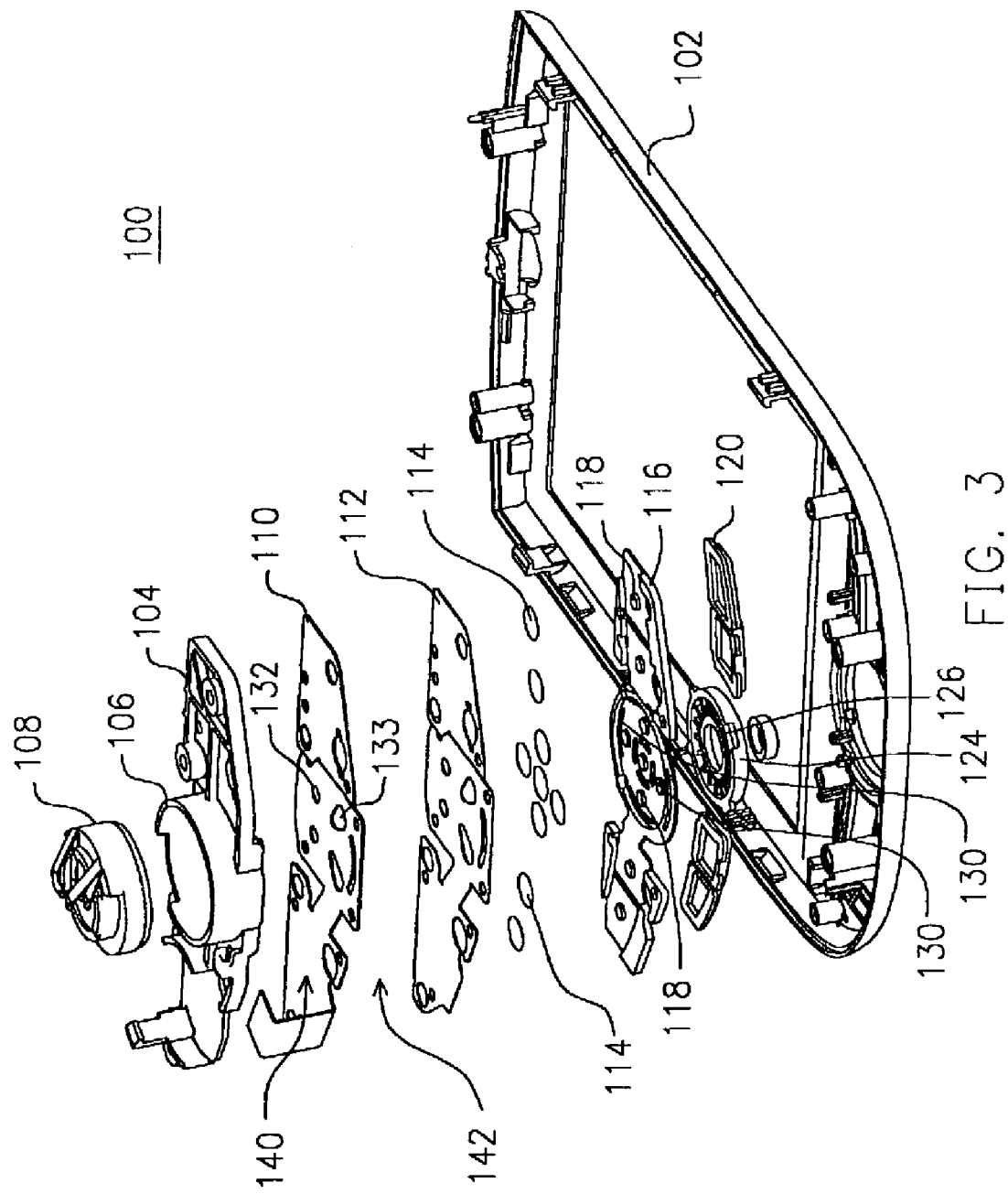
FIG. 3 schematically shows an exploded view of a button apparatus with a speaker and a front cover of a PDA in accordance with a preferred embodiment of the present invention.
Figure 4:
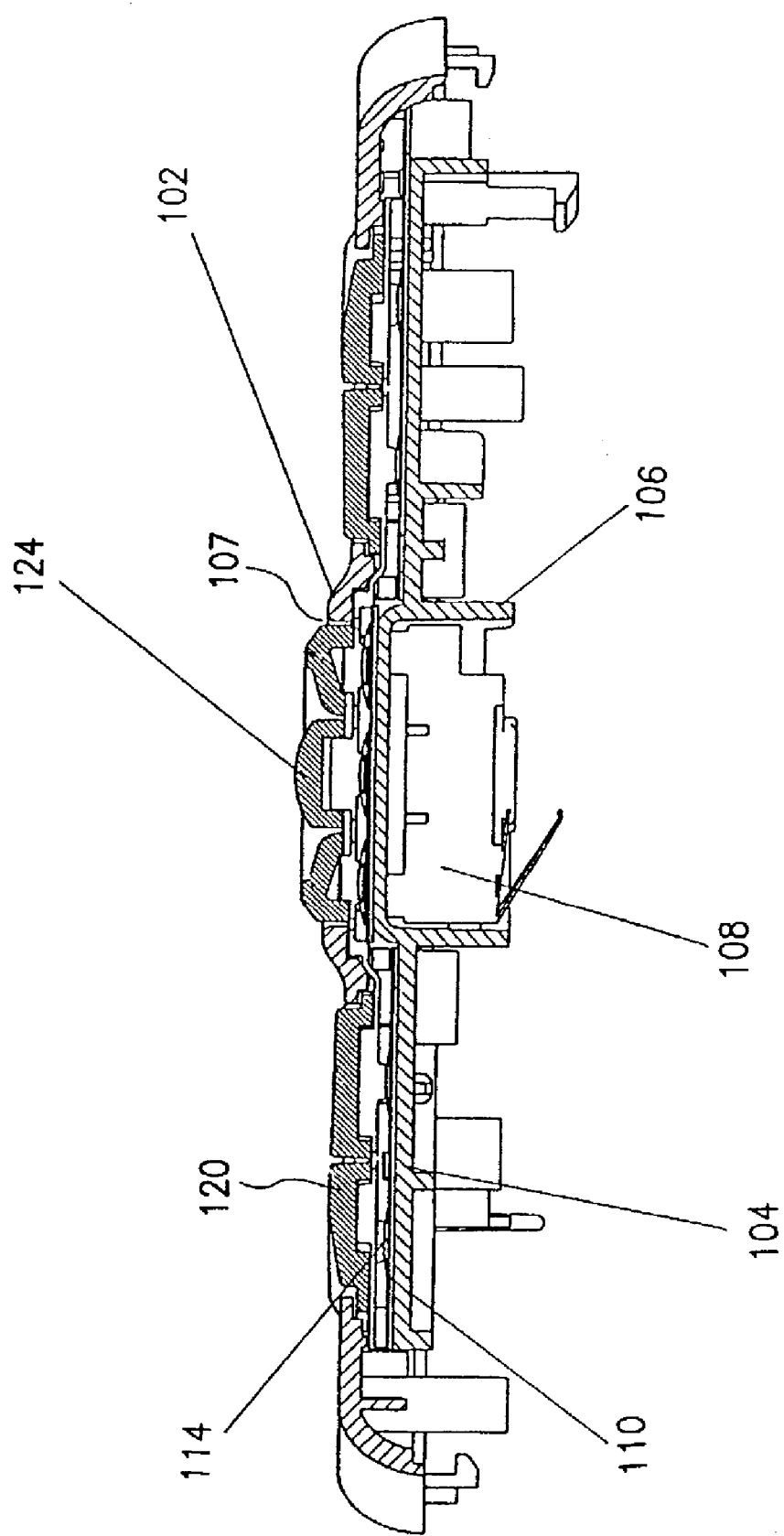
FIG. 4 schematically shows a sectional view of FIG. 3 when the components thereof are assembled together.

Referring to both FIG. 3 and FIG. 4, FIG. 3 schematically shows an exploded view of a button apparatus with a speaker 100 and a front cover 102 of a PDA in accordance with a preferred embodiment of the present invention, and FIG. 4 schematically shows a sectional view of the button apparatus with a speaker 100 and the front cover 102 of FIG. 3 in an assembled state. The button apparatus with a speaker 100 used in the PDA is only an illustrative example. The application of the apparatus with a speaker 100 is not limited to the PDA only; it can be used in other portable electronic products such as palm game units and electronic dictionaries, to thereby reduce an overall thickness of the portable electronic products.

The button apparatus with a speaker 100 provided by the present invention comprises a frame 104 having a cavity 106 inside it to accommodate a speaker 108. Preferably, the frame is made of a hard plastic material and formed by injection molding. The speaker 108 is secured inside the cavity 106. The circuit board of the present invention adopts a flexible PCB (FPCB) 110, which is much thinner than the conventional rigid PCB. The FPCB 110 is located on the frame 104, so that it is supported by the frame 104 to resist a depress force from a button when the button is operated. The FPCB 110 is formed by a multilayer polyester film with a patterned copper foil lamination so as to be easily bent. A plurality of switch contact points 132 are formed on the FPCB 110, and these contact points 132 are not limited to being disposed on the same plane, instead, they can be disposed on different planes based on the space requirement. A Mylar film 112 is put on the FPCB 110. A plurality of metal domes 114 are mounted on the Mylar film 112 corresponding to the contact points 132.

A rubber layer 116 is located on the Mylar film 112 and metal domes 114. A plurality of protrusions 118 are formed on the rubber layer 116, each corresponding to a respective metal dome 114, so that when the rubber layer 116 is depressed, one of the protrusions 118 is motivated to depress against a corresponding metal dome 114, which in turn engages with a corresponding contact point 132. An operating button includes a four-directional control button 124 and four application buttons 120. The control button 124 is used for controlling movement of a cursor of the PDA, and the application buttons 120 each are used for directly activating an operating mode, for example, a calendar mode of the PDA. Moreover, the four-directional control button 124 presses a corresponding protrusion 118 of the rubber layer 116 via one of its four radial extension parts 126. These buttons 120, 124 are mounted in holes (not labeled) of the front cover 102 of the PDA.

For improving the audio quality of the speaker 108, a plurality of holes (not shown) are defined in the frame 104 communicating with the cavity 106. A plurality of holes 133 are defined in the flexible PCB 110 corresponding to the speaker 108. A plurality of holes (not labeled) are defined in the Mylar layer 112 corresponding to the holes 133. Moreover, a plurality of holes 130 are defined in the rubber layer 116 at a position corresponding to the speaker 108. Regarding the operating button, there are two ways to facilitate the broadcast of the sound from the speaker 108. One is forming holes in the four-directional control button 124, the other is, as the drawings show, forming a gap 107 between the four-directional control button 124 and the front cover 102 so that sound generated by the speaker 108 can be transmitted forwardly through the front cover 102 to be heard by a user of the PDA.

Although in the preferred embodiment the speaker 108 is located at a position corresponding to the four-directional control button 124, however, the present invention is not limited to this, and the cavity 106 of the frame 104 can be located on any appropriate position based on the space requirement. The structure of the present invention is mainly characterized in that: the speaker 108 and the button structure (comprising the Mylar layer 112, the metal domes 114, the rubber layer 116, the application buttons 120 and the four-directional control button 124) is located on opposite sides of the flexible PCB 110, respectively. In other words, the button structure is located on a first side 142 of the flexible PCB 110, and the speaker 108 is located on a second side 140 of the flexible PCB 110. Since they are located at different sides in respect to the flexible PCB 110, the location of the speaker 108 is not limited by the operating button 120, 124; such a feature provides design flexibility regarding the position of the speaker 108 so that the space in the PDA can be more economically utilized to enable the PDA incorporating the button apparatus with a speaker 100 in accordance with the present invention to meet the miniaturization requirement.

In summary, the present invention at least has following advantages:

1. Since the button structure of the present invention uses a flexible PCB and a metal dome, whose thickness is about 0.3~0.4 mm, an overall height of the button structure can be significantly reduced so that a thickness of an electronic device incorporating the button apparatus with a speaker in accordance with the present invention can have a low profile.

2. The sound generated by the speaker of the present invention is transmitted in a direction toward a front cover of the electronic device; furthermore, the speaker is fixed in position, rather than move with the movement of the button; thus, sound quality generated by the speaker and received by the user in accordance with the present invention can be improved.

3. The speaker and the button of the present invention are located on opposite sides of the flexible PCB, respectively. Thus they do not interfere with each other; the design is more versatile and the space utilization is more efficient.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

The invention claimed is:

1. A button apparatus with a speaker for a hand-held electronic device, comprising:

a frame;

a speaker received in the frame;

a flexible PCB positioned on the frame, forming a plurality of switch contact points thereon;

a plurality of metal domes positioned on the switch contact points, respectively;

an operating button positioned on the metal domes for depressing a selected one of the metal domes to electrically connect with a corresponding switch contact point;

a film layer between the operating button and the flexible PCB, the film layer holding the metal domes in position corresponding to the switch contact points; and a rubber layer between the operating button and the film layer, the rubber layer forming protrusions toward the metal domes, respectively, wherein when the button is pressed, a selected one of the protrusions is motivated to depress a corresponding metal dome to electrically connect with a corresponding switch contact point.

2. The button apparatus with a speaker of claim 1, wherein the film layer is a Mylar layer.

3. The button apparatus with a speaker of claim 1, wherein the operating button includes a central control button and application buttons beside the control button, a gap is defined between the central control button and a front cover of the electronic device so that sound generated by the speaker can be transmitted forwardly through the front cover.

4. The button apparatus with a speaker of claim 1, wherein the metal domes are disposed on different planes.

* * * * *